(12) United States Patent
Yang

(10) Patent No.: US 6,181,575 B1
(45) Date of Patent: Jan. 30, 2001

(54) SHIELD FOR ELECTRONIC DEVICE

(75) Inventor: Chris Kuo-Wei Yang, Taichung (TW)

(73) Assignee: Hon Hai Preicision Ind. Co., Ltd., Taiepi Hsien (TW)

( * ) Notice: Under 35 U.S.C. 154(b), the term of this patent shall be extended for 0 days.

(21) Appl. No.: 09/291,819

(22) Filed: Apr. 14, 1999

(30) Foreign Application Priority Data

Oct. 6, 1998 (TW) ................................................ 87216522

(51) Int. Cl.[7] ...................................................... H05K 9/00
(52) U.S. Cl. ......................... 361/816; 361/818; 361/801; 361/802; 361/800; 361/741
(58) Field of Search ..................................... 361/683, 686, 361/753, 756, 758, 788, 796, 799–802, 740, 741, 759, 816, 818, 825; 174/35 R, 35 GC, 51; 439/607

(56) References Cited

U.S. PATENT DOCUMENTS 4,964,017 * 10/1990 Jindrick et al. ...................... 361/752
5,600,538 * 2/1997 Xanthopoulos ...................... 361/683

* cited by examiner

Primary Examiner—Jayprakash N. Gandhi
Assistant Examiner—Phuong T. Vu
(74) Attorney, Agent, or Firm—Wei Te Chung

(57) ABSTRACT

A shield adapted to protect an electronic device from electromagnetic interference includes a shielding panel having two board support arms extending from opposite sides thereof. Each board support arm defines an elongate slot therein extending in a direction substantially normal to the panel from a remote end to a proximal end. An expanded hole is defined in the board support arm at the remote end of the slot and communicates with the slot by means of a converging section whereby a mounting extension of a circuit board of the electronic device is received in the slot by being inserted in the expanded hole and guided by the converging section into the slot toward the proximal end thereof. The expanded hole facilitates the insertion of the mounting extension into the slot thus the width of the slot may be dimensioned to securely retain the circuit board without interfering with the insertion of the circuit board. The expanded hole also facilitates removal of the circuit board from the slot.

6 Claims, 4 Drawing Sheets

SHIELD FOR ELECTRONIC DEVICE

BACKGROUND OF THE INVENTION

1. Field of the Invention

The present invention generally relates to an electrical shield for protecting an electronic device from electromagnetic interference, and in particular to a shield that securely retains a circuit board to be protected thereon.

2. The Prior Art

Electrical shields are usually mounted inside an electronic device, such as a computer, to shield and protect a circuit board of the electronic device from external electromagnetic interference. FIG. 4 of the attached drawings shows a conventional shield designated by reference numeral 4. The shield 4 comprises a panel having flanges 41 for fitting in corresponding openings defined in the casing of the electronic device thereby securing the shield 4 in the casing. The shield 4 has two board support arms 42 extending from opposite sides thereof. Each board support arm 42 has an elongate slot 43 for receiving and retaining an extension 50 of a circuit board 5 therein. However, the size (width) of the slot 43 has to be precisely dimensioned to ensure a proper fit with the corresponding extension 50. If the slot 43 is too wide, the circuit board 5 cannot be securely retained, while a slot 43 that is too narrow hinders insertion of the extension 50 into the slot 43.

It is thus desirable to have a shield that overcomes the problems of the prior art.

SUMMARY OF THE INVENTION

Accordingly, an object of the present invention is to provide a shield including a board support arm defining an elongate slot with an expanded end for facilitating insertion of the circuit board into the slot, improving retention of the circuit board, and expediting removal of the circuit board.

To achieve the above objects, a shield in accordance with the present invention comprises a shielding panel having two board support arms extending from opposite sides thereof. Each board support arm defines an elongate slot therein extending in a direction substantially normal to the panel from a remote end to a proximal end. An expanded hole is defined in the board support arm at the remote end of the slot and communicates with the slot by means of a converging section whereby a mounting extension of a circuit board of the electronic device is received in the slot by being inserted in the expanded hole and guided by the converging section into the slot toward the proximal end thereof. The expanded hole facilitates the insertion of the mounting extension into the slot thus the width of the slot may be dimensioned to securely retain the circuit board without interfering with the insertion of the circuit board. The expanded hole also facilitates removal of the circuit board from the slot.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
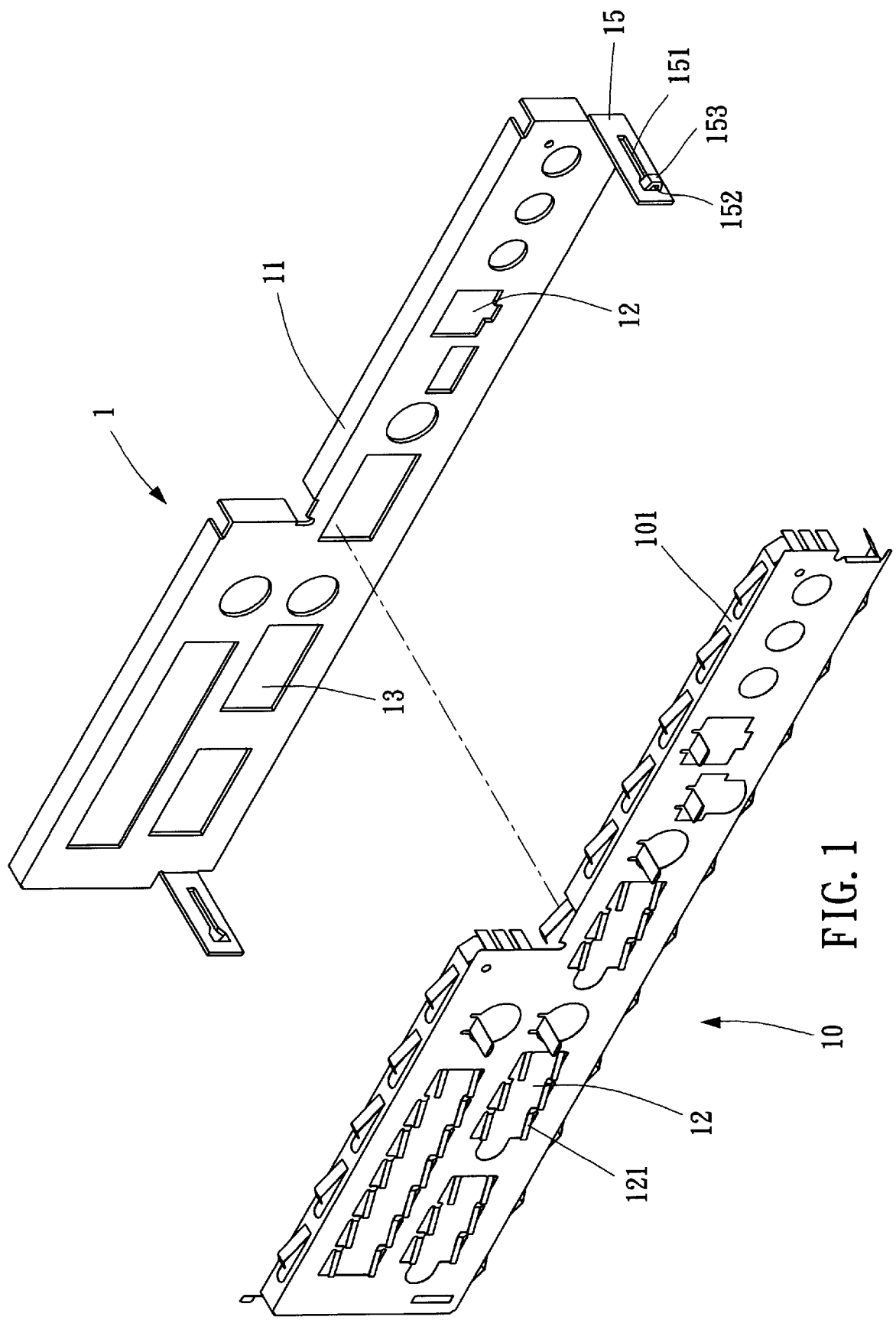
FIG. 1 is an exploded view of a shield constructed in accordance with the present invention.

Referring to the drawings and in particular to FIG. 1, wherein a shield adapted to be mounted in an electronic device (not shown) for protecting a circuit board of the electronic device is shown, the shield comprises an outer panel 1 and an inner panel 10. The inner and outer panels 10, 1 define aligned openings 12, 13 therein for receiving connectors (not shown) mounted on the circuit board.

The outer panel 1 is usually made from a thick metal blank for providing mechanical strength, while the inner panel 10 is made from a thin metal blank for facilitating the formation of resilient projections 121 by means of pressing. The resilient projections 121 electrically engage with the connectors for electrical grounding purposes.

The outer panel 1 is provided with flanges 11 for fitting into corresponding openings defined in a casing (not shown) of the electronic device to secure the outer panel 1 to the casing. Similarly, the inner panel 10 is provided with flanges 101 to fit over the flanges 11 of the outer panel 1.

Figure 2:
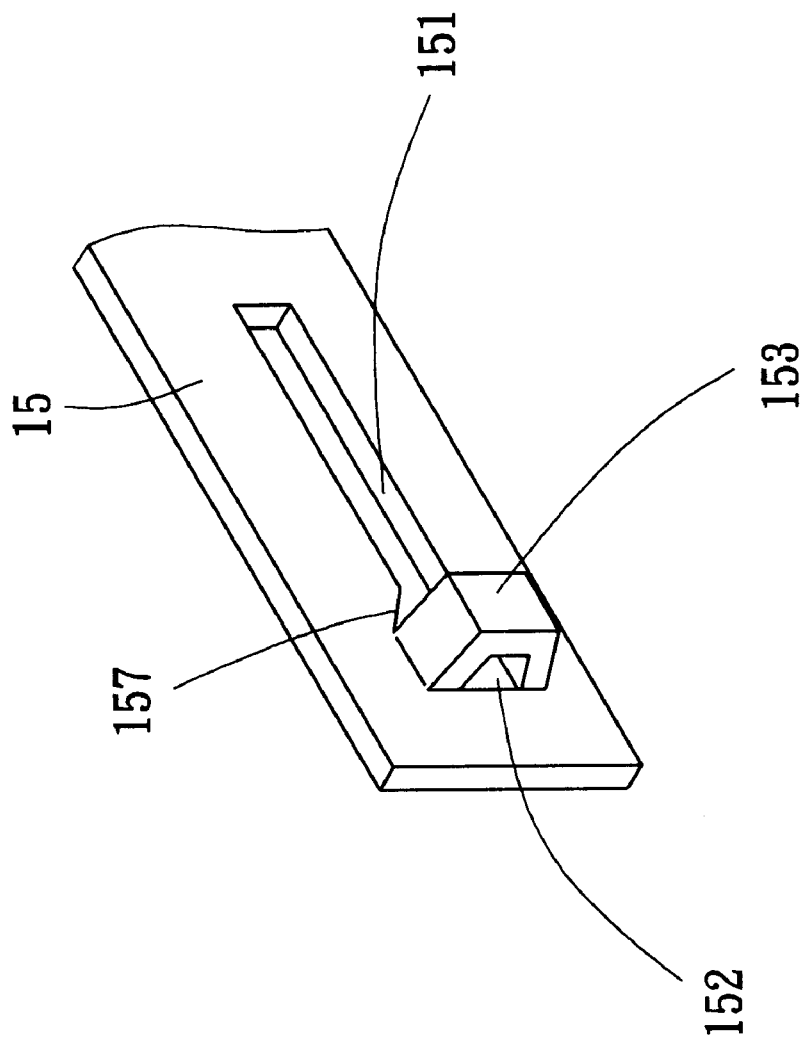
FIG. 2 is a perspective view of a board support arm of the shield of the present invention.

The outer panel 1 comprises two board support arms 15 extending from opposite sides thereof. As shown in FIG. 2, each board support arm 15 defines an elongate slot 151 therein. The slot 151 extends in a direction substantially normal to the outer panel 1 from a remote end to a proximal end thereof. An expanded hole 152 is defined at the remote end of the slot 151 and communicates with the slot 151 by means of a converging section 157. A U-shaped retainer 153 is formed on the board support arm 15 traversing the expanded hole 152 and partially extending along the slot 151.

Figure 3:
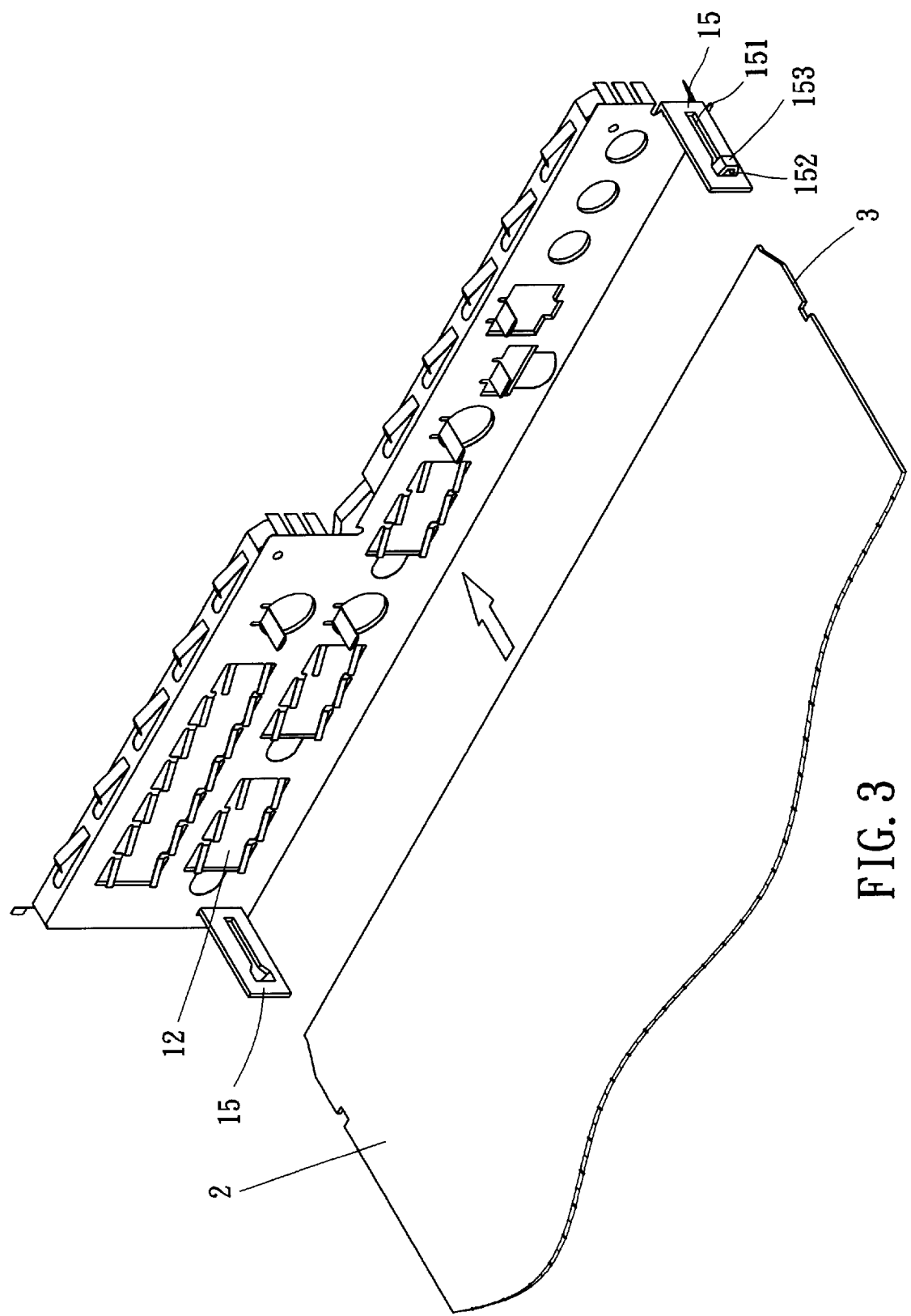
FIG. 3 is a perspective view of the shield of the present invention and a circuit board to be attached thereto.
Figure 4:
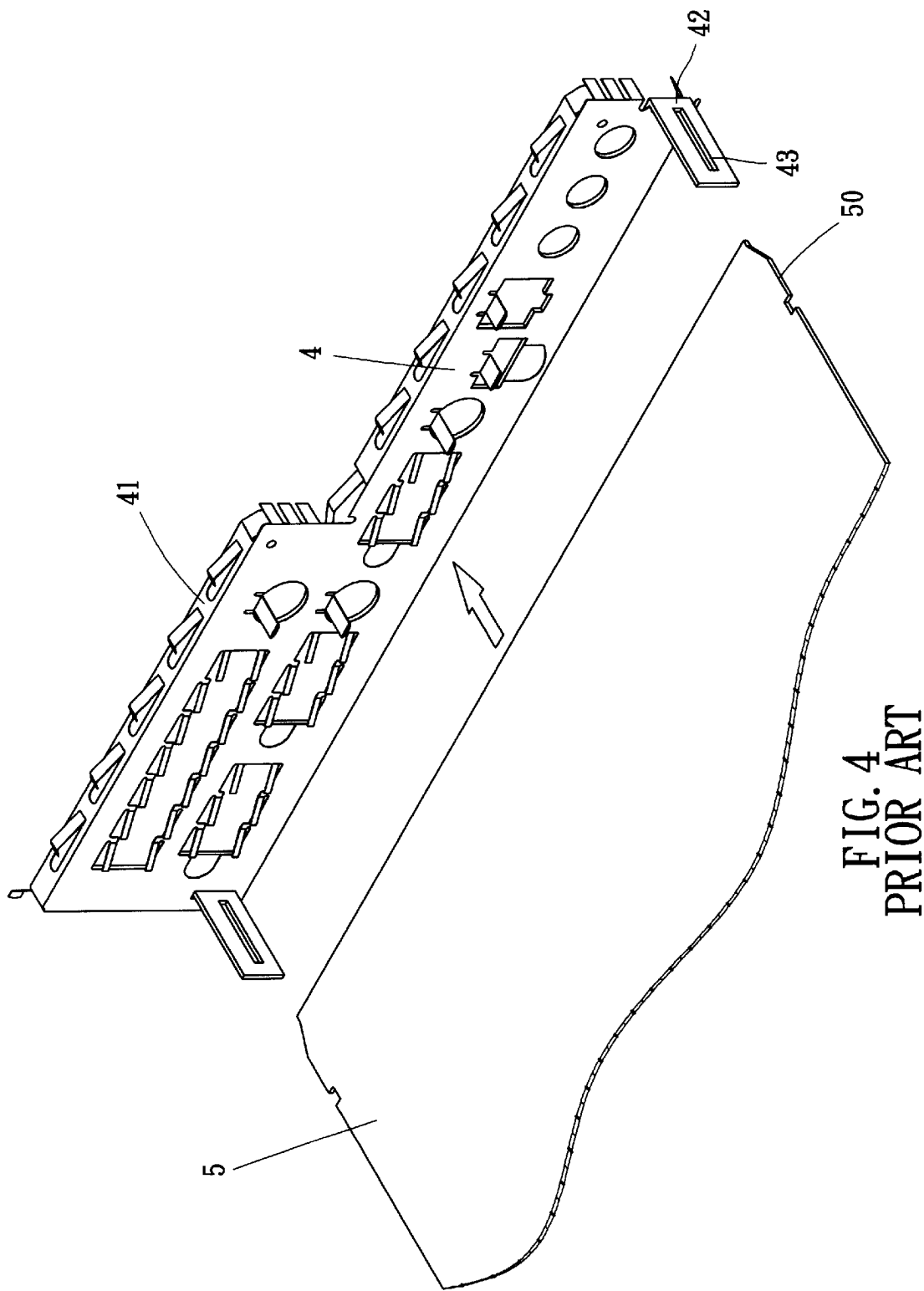
FIG. 4 is a perspective view of a prior art shield and a related circuit board.

As shown in FIG. 3, a circuit board 2 having mounting extensions 3 formed at opposite sides thereof is supported by the board support arms 15 of the outer panel 1 of the shield. The extension 3 is inserted into the slot 151 via the expanded hole 152. The converging section 157 guides the extension 3 into the slot 151 toward the proximal end to fully receive the extension 3 in the slot 151.

Due to the provision of the expanded hole 152, the insertion of the extension 3 of the circuit board 2 into the slot 151 is facilitated and the width of the slot 151 may be dimensioned to promote a tighter engagement between the slot 151 and the circuit board 2 thereby more securely retaining the circuit board 2 in the board support arms 15.

The U-shaped retainer 153 prevents the extension 3 of the circuit board 2 from being displaced out of position with respect to the slot 151 of the board support arm 15 during insertion of the extension 3 into the slot 15 1. The retainer 153 also retains the circuit board 2 in position in the lateral direction with respect to the board support arm 15.

Although the present invention has been described with reference to a preferred embodiment thereof, it is apparent to those skilled in the art that a variety of modifications and changes may be made without departing from the scope of the present invention which is intended to be defined by the appended claims.

What is claimed is:

1. A shield and a circuit board assembly, wherein the circuit board has a mounting extension formed at one side thereof, the shield comprising a shielding panel having two board support arms extending from opposite sides thereof, each board support arm defining an elongate slot therein extending in a direction substantially normal to the panel from a remote end to a proximal end, an expanded hole being defined in the board support arm at the remote end of the slot and communicating with the slot by means of a converging section, wherein the mounting extension of the circuit board is received in the slot by being inserted into the expanded hole and guided by the converging section into the slot toward the proximal end thereof.

2. The shield and the circuit board assembly as claimed in claim 1, wherein the board support arm further comprises a U-shaped retainer member traversing the slot for preventing the mounting extension of the circuit board from being displaced out of position with respect to the slot in a lateral direction.

3. The shield and the circuit board assembly as claimed in claim 1, wherein the shielding panel comprises flanges adapted to fit into corresponding openings defined in a casing that houses the circuit board.

4. The shield and the circuit board assembly as claimed in claim 1, wherein the shield panel defines a plurality of openings therein adapted to receive electrical connectors mounted to the circuit board.

5. The shield and the circuit board assembly as claimed in claim 4 further comprising an additional panel member attached to the shielding panel, the additional panel member defining a plurality of openings aligned with openings of the shielding panel, the openings of the additional panel member comprising resilient projections for engaging with the corresponding connector.

6. A shielding comprising a shielding panel having a plurality of holes therein, a flange extending perpendicularly from a top edge of the shielding panel, two board support arms extending at two opposite ends of the shielding panel in a direction opposite to said flange, each of said support arms defining an elongated slot along a longitudinal direction thereof with an expanded hole at an end of said slot around a free end of said support arm, and a U-shaped retainer member formed on the board support arm traversing the expanded hole and partially extending along the slot.

* * * * *